United States Patent [19]

Dickens

[11] 3,775,701

[45] Nov. 27, 1973

[54] SEMICONDUCTOR DIODE MOUNTING AND RESONATOR STRUCTURE FOR OPERATION IN THE EHF MICROWAVE RANGE

[75] Inventor: Lawrence E. Dickens, Baltimore, Md.

[73] Assignee: Westinghouse Electric Corporation, Pittsburgh, Pa.

[22] Filed: Jan. 21, 1972

[21] Appl. No.: 219,717

[52] U.S. Cl. .......................... 331/96, 330/5, 330/34, 330/56, 331/107 R, 331/107 G, 333/83 R

[51] Int. Cl. ............................................. H03b 7/14

[58] Field of Search .............. 331/96, 107 R, 107 G, 331/107 T; 330/5, 34, 56; 333/82 R, 83 R

[56] References Cited

UNITED STATES PATENTS

| | | | |
|---|---|---|---|
| 3,254,309 | 5/1966 | Miller | 331/107 T X |
| 3,141,141 | 7/1964 | Sharpless | 331/107 T |
| 3,160,826 | 12/1964 | Marcatili | 330/34 X |

*Primary Examiner*—Roy Lake
*Assistant Examiner*—Siegfried H. Grimm
*Attorney*—F. H. Henson et al.

[57] ABSTRACT

A semiconductor mounting and resonator structure particularly suitable for avalanche diode applications in the EHF microwave range, characterized in having a high degree of mechanical reliability, good heat transfer characteristics for heat generated by the diode and efficient coupling of high frequency wave energy from the diode to external waveguide circuitry.

7 Claims, 4 Drawing Figures

SEMICONDUCTOR DIODE MOUNTING AND RESONATOR STRUCTURE FOR OPERATION IN THE EHF MICROWAVE RANGE

BACKGROUND OF THE INVENTION

While not limited thereto, millimeter wave communication systems are primarily intended for use in space applications. In such cases, maximum mechanical reliability and rugged construction are of primary importance; however, the efficiency of the device in coupling high frequency wave energy in the EHF range is also a prime requirement.

Conventionally, oscillator diodes of the avalanche or Gunn types have been mounted in ceramic and metal structures normally used for varactor diodes. The oscillator diode in such structures is mounted on a metal stud and surrounded by a ceramic or the like insulator. Resting on top of the insulator is a metal ring having bonded thereto a metal ribbon or wire which engages and is bonded to the side of the diode opposite the stud. While the thermal and mechanical characteristics of a device of this type are excellent, mounting structure parasitics (i.e., the inductive and capacitive effects associated with the mounting structure) tend to drastically decouple the diode from the input-output terminals of the device when operated in the EHF range, above 30 GHz. Hence, conventional mounting structures for avalanche or Gunn diodes are not suitable for this purpose.

Heretofore, mounting structures for avalanche diodes and Gunn oscillators have been provided for operation in the EHF range. In these prior art forms, the microwave circuit usually included a short, tunable section of rectangular waveguide having a conductive post or cap structure extending across the guide from one broad wall to the other. The post structure was conductively connected in series to the semiconductor element and one broad wall, and was so disposed at the opposing broad wall so as to permit the insertion of a direct current bias as required by the diode. The difficulty with these prior art mounting structures, however, is that they suffer from either poor mechanical, thermal or electrical characteristics.

SUMMARY OF THE INVENTION

In accordance with the present invention, a semiconductor mounting structure is provided for avalanche diode and the like applications, which structure combines high mechanical reliability, good heat transfer characteristics from the diode and good electrical efficiency in the EHF region for coupling wave energy generated by the diode to external waveguide circuitry. More specifically, the invention provides a means by which a small, fragile, semiconductor element can be embodied in a radio-frequency circuit while maintaining efficient coupling to an external load, maintaining a low thermal impedance, and at the same time, being capable of tolerating severe thermal expansion of the pertinent elements.

A feature of the invention resides in the provision of a diode contacting means by which a direct current bias may be supplied to the diode and the radio-frequency circuit may likewise be coupled to the diode, but so disposed as to maintain high isolation between the bias circuit and the microwave circuit.

Another feature of the invention resides in the provision of a diode contacting means for avalanche diode applications in the EHF microwave range of low mass yet positive contacting pressure so as to attain good physical and mechanical stability and reliability.

Still another feature of the invention is the provision of a diode contacting means of the type described above which permits the efficient coupling of high frequency energy in the EHF range from an avalanche diode or the like to external waveguide circuitry.

The above and other objects and features of the invention will become apparent from the following detailed description taken in connection with the accompanying drawings which form a part of this specification, and in which.

Figure 1:
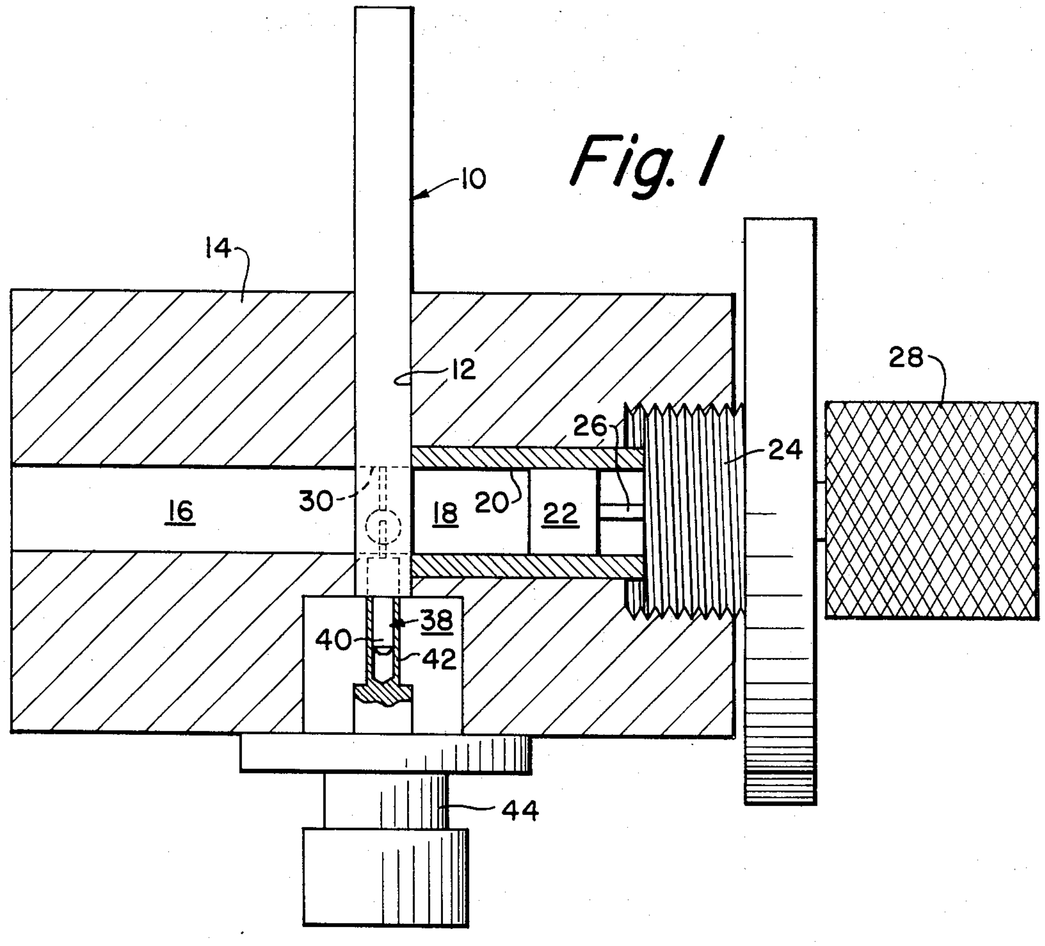
FIG. 1 is a cross-sectional view of one embodiment of the invention showing the manner in which an avalanche diode or the like is carried within a flat metal wafer and is connected to external waveguide circuitry.

With reference now to the drawings, and particularly to FIG. 1, there is shown a flat metal wafer 10 typically having the dimensions 0.8 × 0.25 × 0.1 inch. The wafer 10 slides into a slot 12 provided in a metal block or housing 14. On one side of the wafer 10 is a waveguide section 16 which couples to external waveguide circuitry, not shown. On the opposite side of the wafer 10 is a short-waveguide section 18 formed by a sleeve 20 fitted into an opening formed in the housing 14. Carried within the short-waveguide section 18 is a radio-frequency tuner 22 comprising a sliding waveguide short-circuit. The wafer 10 is held solidly in place by the sleeve 20 which can slide in the housing 14 and which presses against the wafer 10 by action of a jam screw 24 threaded into the housing. The tuner 22 is connected through a shaft 26 and a bore in the jam screw 24 to rotatable and captive screw arrangement 28 which, upon rotation, can cause the tuner 22 to move to the right or left as viewed in FIG. 1.

Figure 2:
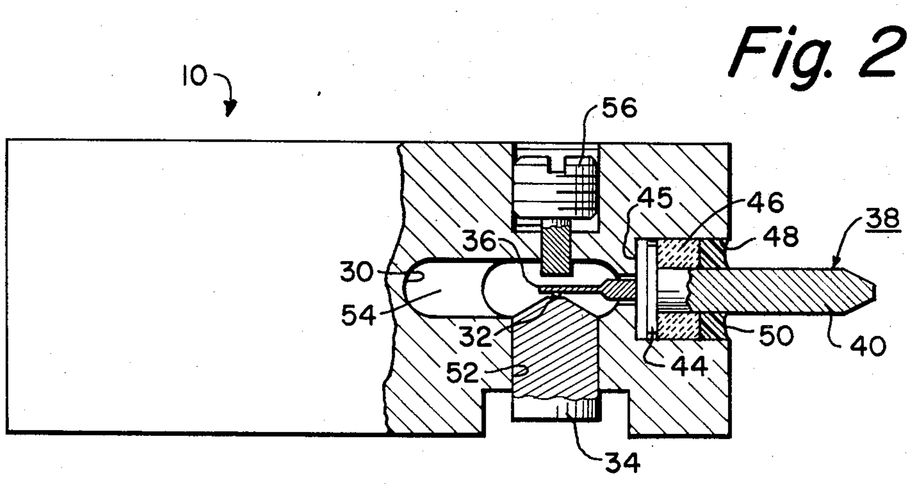
FIG. 2 is an elevational view, partly in section, of the flat metal wafer shown in FIG. 1, and incorporating an iris within which is positioned a diode mount.
Figure 3:
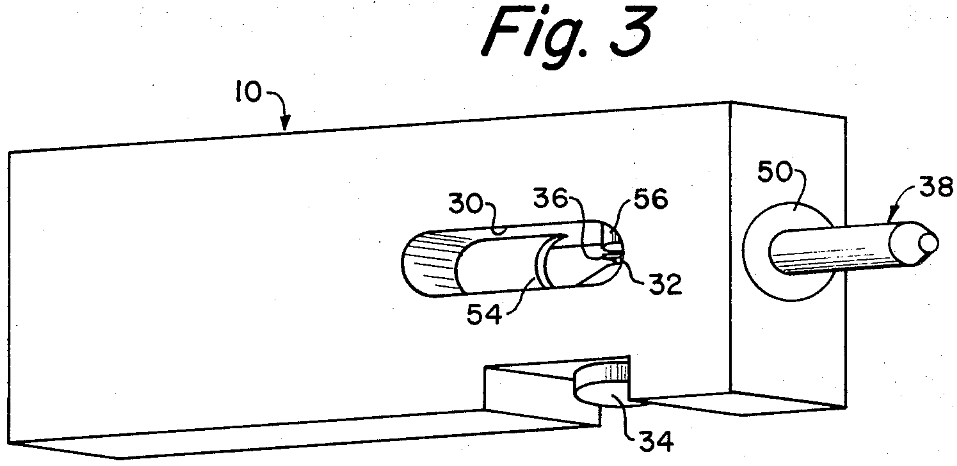
FIG. 3 is a perspective view of the wafer of FIG. 2.

With reference now to FIGS. 2 and 3, the wafer 10 has an iris 30 extending therethrough, the iris not necessarily having the same cross-sectional area and being aligned with the waveguide sections 16 and 18. Carried within the iris 30 is an avalanche or Gunn-type diode 32 mounted on a copper base heat sink 34. The diode 32 is affixed to the heat sink 34 and contacted by means of a bias lead-in cantilever beam 36 formed from electrical conducting material and connected to a bias pin assembly, generally indicated by the reference numeral 38. The bias pin assembly 38 includes a contact pin 40 which, as shown in FIG. 1, is inserted into a mating contact receptacle 42 adapted for connection through coupling 44 to a source of bias potential for the diode 32. The pin 40 has an enlarged diameter portion 44 (FIG. 2) which abuts against a ruby mica washer 45 included for the purpose of returning radio-frequency currents from the diode to ground potential (i.e., the wafer 10).. An insulating spacer 46 such as quartz positions the pin within an opening 48 in the wafer 10, the pin assembly 38 being permanently fixed within the opening 48 by an adhesive and sealant material 50, typically a thermosetting epoxy or glass-to-metal seal. A positive contact is made between the cantilever contact 36 and the diode 32, at which time the diode, already affixed to the heat sink 34, is press-fit into a bore 52 in the wafer 10. In this regard, the heat sink 34 is inserted into the wafer 10 to a sufficient depth and extent to cause the diode 32 to contact the beam 36 and deflect it within its elastic limit so as to cause the beam to maintain positive pressure on the diode throughout any condition of operation. The length of the contacting beam 36 as measured from the point of contact with the diode 32 to the plane of the ruby washer 45 is made to be nominally one-quarter wavelength. This aids in obtaining the desired isolation between the radio-frequency currents and the bias port. A web 54 extends into the iris 30 from the side opposite the beam 36 and acts as a metallic septum which closes off part of the iris in such a manner as to reduce the effective shunt inductance, raise the fundamental resonant frequency, and contain within the wafer 10 and the immediate vicinity of the diode the major portion of the reactive circulating radio-frequency currents of the oscillating diode as is required for high efficiency operation. On the side of the beam 36 opposite the diode 32 is a capacitive coupling screw 56 which can be adjusted so as to vary the capacitive coupling of the waveguide impedance to the diode 32.

Figure 4:
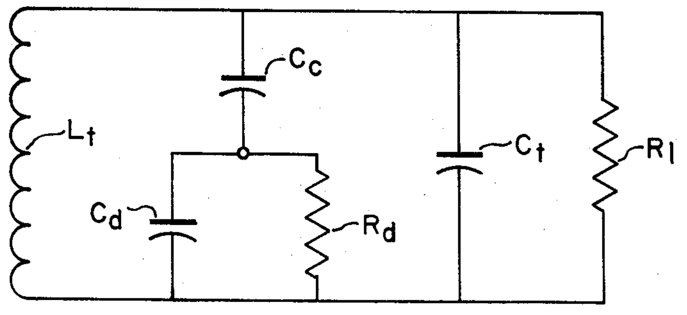
FIG. 4 is an equivalent circuit diagram of the semiconductor mounting and resonator structure of the invention.

The equivalent circuit of the mounting and resonator structure shown in FIGS. 1–3 is illustrated in FIG. 4 where the diode 32 is represented by the parallel combination of resistor $R_d$ and capacitor $C_d$, where $R_d$ is negative if diode 32 is an oscillator or amplifier diode. The coupling capacitor $C_c$ represents the capacitive tuning screw 56; while the tuning reactances $L_t$ and $C_t$ are made up of the parallel combination of the inductive effect of the septum 54 and the tuning short 22. The load resistance $R_l$ is the value of waveguide impedance from waveguide 16 and transformed to the reference plane of the diode. Note that because of the resonant configuration, the device can support oscillations in the EHF range. Thus, the invention combines the advantages of rugged mechanical construction, good heat transfer characteristics through the heat sink 34 and excellent electrical characteristics which enable the device to operate at high microwave frequencies.

Although the invention has been shown in connection with a certain specific embodiment, it will be readily apparent to those skilled in the art that various changes in form and arrangement of parts may be made to suit requirements without departing from the spirit and scope of the invention.

What is claimed is:

1. A semiconductor mounting and resonator structure comprising means defining a waveguide iris, a heat sink projecting into said iris from a long transverse side of the iris, a surface on said heat sink for supporting a semiconductive wafer, cantilever beam means projecting into said iris from the short transverse side of the iris and engaging at its outer end said semiconductive wafer to hold the wafer on said surface of the heat sink, means coupled to said cantilever beam for supplying a bias voltage to said wafer, and waveguide means coupled to said iris for transmitting wave energy generated by said semiconductive wafer to an external waveguide circuit.

2. The mounting and resonator structure of claim 1 wherein said waveguide means comprises a first waveguide section on one side of said iris, and a second waveguide section on the other side of said iris.

3. The semiconductor mounting and resonator structure of claim 2 wherein said semiconductive wafer is further defined as a diode, said mounting and resonator structure including an adjustable capacitive screw disposed on the side of said cantilever beam opposite said diode for capacitively coupling the impedance of said waveguide sections to the diode.

4. The mounting and resonator structure of claim 3 including a metallic septum extending into and closing off part of said iris on the side of said diode opposite said cantilever beam to reduce the effective shunt inductance of the structure, raise the fundamental resonant frequency and to contain within the diode and the immediate vicinity of the diode the major portion of reactive circulating radio-frequency currents, incident to transmitting wave energy generated by said diode.

5. The mounting and resonator structure of claim 2 including a prong connected to said cantilever beam for connection to an external bias circuit, and capacitor bypass means associated with said prong for returning radio-frequency currents from the diode to ground potential.

6. The mounting and resonator structure of claim 5 wherein said iris is formed in a flat metal wafer and said prong extends through an end of said wafer, the means for bypassing said radio-frequency currents comprising an insulating washer between a portion of said prong and said wafer.

7. The mounting and resonator structure of claim 6 wherein said wafer slides into a slot in a housing defining said first and second waveguide sections, and means within one of said sections for holding said wafer in place within said slot.

* * * * *